(12) United States Patent
Mease et al.

(10) Patent No.: US 6,870,743 B2
(45) Date of Patent: Mar. 22, 2005

(54) CELLULAR COMPUTER SYSTEM

(75) Inventors: Keith D. Mease, Gibbstown, NJ (US); Sean M. McClain, Havertown, PA (US); Joseph J. Scorsone, West Chester, PA (US); Daniel A. Jochym, Downingtown, PA (US); David H. Chase, Minneapolis, MN (US)

(73) Assignee: Unisys Corporation, Blue Bell, PA (US)

( * ) Notice: Subject to any disclaimer, the term of this patent is extended or adjusted under 35 U.S.C. 154(b) by 94 days.

(21) Appl. No.: 10/390,355

(22) Filed: Mar. 17, 2003

(65) Prior Publication Data

US 2004/0184251 A1 Sep. 23, 2004

(51) Int. Cl.[7] .............................. H05K 7/14; H05K 5/00
(52) U.S. Cl. ....................... 361/796; 361/752; 361/736; 361/730; 174/52.1; 211/41.17
(58) Field of Search ................................ 361/796, 788, 361/752, 736, 730, 728; 174/50, 50.52, 52.1; 211/41.17

(56) References Cited

U.S. PATENT DOCUMENTS

| | | | | |
|---|---|---|---|---|
| 5,726,866 A | * | 3/1998 | Allen | 361/816 |
| 5,808,876 A | * | 9/1998 | Mullenbach et al. | 361/788 |
| 5,818,696 A | * | 10/1998 | Knoop | 361/730 |
| 5,822,551 A | * | 10/1998 | Crane et al. | 710/307 |
| 6,155,842 A | * | 12/2000 | Baitz | 439/61 |
| 6,220,456 B1 | * | 4/2001 | Jensen et al. | 211/26 |
| 6,498,732 B2 | * | 12/2002 | Sucharczuk et al. | 361/796 |
| 6,643,141 B2 | * | 11/2003 | Kaetsu et al. | 361/797 |
| 6,690,584 B2 | * | 2/2004 | Uzuka et al. | 361/796 |

* cited by examiner

Primary Examiner—Kamand Cuneo
Assistant Examiner—Dameon E. Levi
(74) Attorney, Agent, or Firm—Lisa A. Rode; Mark T. Starr; RatnerPrestia

(57) ABSTRACT

A computer module for use in a scalable computer system is provided. The computer module includes a chassis at least partially defining an interior and a processor board configured for insertion into a processor region of the interior of the chassis along an insertion axis. The processor board includes at least one connector for communicating signals to and from the processor board. The connector of the processor board is oriented along a connection axis that is substantially perpendicular to the insertion axis. The computer module also includes a memory board configured for insertion into a memory region of the interior of the chassis along the insertion axis. The memory board includes at least one connector for communicating signals to and from the memory board. The connector of the memory board is oriented along the connection axis.

20 Claims, 10 Drawing Sheets

CELLULAR COMPUTER SYSTEM

FIELD OF THE INVENTION

This invention relates to a computer module, and more particularly to interconnection configurations for a plurality of cellular computer modules.

BACKGROUND OF THE INVENTION

In computer systems such as server systems, for example, it is often desirable to increase processor and bus frequencies, and as such, it is also desirable to decrease transmission times between system elements. The desire to decrease transmission times between these system elements is particularly relevant in computer server systems because the inclusion of multiple processor and memory elements in a computer server system creates additional transmission paths, thereby resulting in an increase in the distance over which the signals are transmitted.

One method to decrease the transmission time (i.e., the flight time) between server system elements is to increase the velocity of transmission. Another possible method of decreasing the transmission time is to reduce the distance between the server system components.

Unfortunately, in cellular computer systems having multiple processor systems, it is particularly difficult to reduce the interconnect length between elements because the transmission paths follow the design of connectors and printed circuit boards included in each of the cellular components. In a cellular component configuration, the packaging of each of the individual cells drives the cells farther apart from one another, thereby making it even more difficult to reduce interconnect lengths between and within cellular computer components.

As such, it would be desirable to provide a cellular computer system that can be configured for reduced interconnect lengths between and within each of the cellular components, thereby decreasing signal transmission time between the system elements.

SUMMARY OF THE INVENTION

In an exemplary embodiment of the present invention, a computer module for use in a scalable computer system is provided. The computer module includes a chassis at least partially defining an interior and a processor board configured for insertion into a processor region of the interior of the chassis along an insertion axis. The processor board includes at least one connector for communicating signals to and from the processor board. The connector of the processor board is oriented along a connection axis that is substantially perpendicular to the insertion axis. The computer module also includes a memory board configured for insertion into a memory region of the interior of the chassis along the insertion axis. The memory board includes at least one connector for communicating signals to and from the memory board. The connector of the memory board is oriented along the connection axis.

In another exemplary embodiment of the present invention, a computer system is provided. The computer system includes a rack configured to accommodate components of the computer system. The computer system also includes an interconnect assembly mounted in the rack and at least two cellular computer modules. Each of the cellular computer modules includes a respective processor board and a respective memory board. The cellular computer modules are connected to opposite surfaces of the interconnect assembly such that the processor board of one of the cellular computer modules is positioned opposite the memory board of another of the cellular computer modules and is separated from the memory board of the another cellular computer module by the interconnect assembly.

In yet another exemplary embodiment of the present invention, a method of configuring a computer system is provided. The method includes positioning an interconnect assembly within a rack of the computer system. The method also includes inserting a first cellular computer module having a processor board and a memory board within the rack, and connecting the processor and memory boards of the first cellular computer module to a surface of the interconnect assembly. The method also includes inserting a second cellular computer module having a processor board and a memory board within the rack and connecting the processor and memory boards of the second cellular computer module to an opposite surface of the interconnect assembly such that the positions of the first and second cellular computer modules correspond to one another with respect to the interconnect assembly. As such, the processor board of the first cellular computer module is substantially opposite the memory board of the second cellular computer module, and the memory board of the first cellular computer module is substantially opposite the processor board of the second cellular computer module.

BRIEF DESCRIPTION OF THE DRAWINGS

Exemplary embodiments of the invention will be described with reference to the drawings, of which.

DETAILED DESCRIPTION OF THE INVENTION

Figure 1:
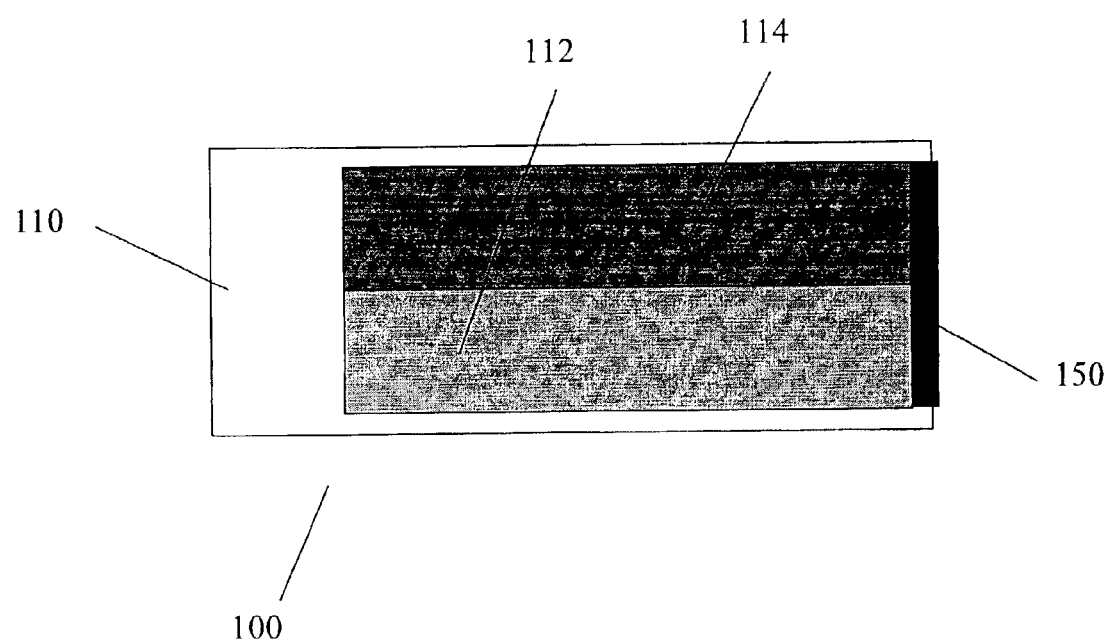
FIG. 1 is a front view of a block diagram illustrating a computer module and an interconnect assembly in accordance with an exemplary embodiment of the present invention.

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Referring to the figures generally, in an exemplary embodiment of the present invention, a computer module 700 for use in a scalable computer server system 900 is provided. Computer module 700 includes chassis 710 at least partially defining an interior, and processor board 714 configured for insertion into a processor region of the interior of chassis 710 along an insertion axis. Processor board 714 includes at least one connector 714a for communicating signals to and from processor board 714. Connector 714a of processor board 714 is oriented along a connection axis that is substantially perpendicular to the insertion axis.

Computer module 700 also includes memory board 712 configured for insertion into a memory region of the interior of chassis 710 along the insertion axis. Memory board 712 includes at least one connector 712a for communicating signals to and from memory board 712. Connector 712a of memory board 112 is oriented along the connection axis. Accordingly, in one exemplary embodiment, the memory and processor boards share substantially the same insertion and connection axes.

In another exemplary embodiment of the present invention, computer server system 900 is provided. Computer server system 900 includes a rack (not shown) into which the frame 901 can be mounted, wherein the rack is configured to accommodate components of computer server system 900. Computer server system 900 also includes interconnect assembly 1050 mounted in the rack (not shown) configured to receive frame 901 and at least two cellular computer modules 700. Each of the cellular computer modules 700 includes a processor board such as processor board 1014 and a memory board such as memory board 1012. Cellular computer modules 700 are connected to opposite surfaces of interconnect assembly 1050 such that processor board 1014 of one of cellular computer modules 700 is positioned substantially opposite memory board 1032 of another of cellular computer modules 700 and is separated from memory board 1032 of the another cellular computer module 700 by interconnect assembly 1050.

In yet another exemplary embodiment of the present invention, a method of configuring a computer server system is provided. The method includes a step 1102 of positioning an interconnect assembly within a rack of the computer server system. The method also includes a step 1104 of inserting a first cellular computer module having a processor and a memory board within the rack, and connecting the processor and memory boards of the first cellular computer module to a surface of the interconnect assembly. The method also includes a step 1106 of inserting a second cellular computer module having a processor board and a memory board within the rack and connecting the processor and memory boards of the second cellular computer module to an opposite surface of the interconnect assembly such that the positions of the first and second cellular computer modules correspond to one another with respect to the interconnect assembly. As such, the processor board of the first cellular computer module is substantially opposite the memory board of the second cellular computer module, and the memory board of the first cellular computer module is substantially opposite the processor board of the second cellular computer module.

Through the various exemplary embodiments disclosed herein, the present invention provides for a multiple processor system that may be viewed as a plurality of cellular components. The cellular components are arranged in a rack of a computer system in an orientation that substantially reduces the interconnect lengths between and within the cellular components. As will be explained herein, certain embodiments of the present invention are applicable to a singular cell system, while other embodiments are applicable to multiple cellular configurations (e.g., two cell, three cell, four cell configurations, etc.).

In an exemplary embodiment of the present invention, a single cell system can be mounted within a standard 19 inch rack, taking up only 4U of height in the rack.

In another exemplary embodiment the present invention, four 8-processor systems (cellular modules) can be mounted in a standard 19 inch rack, thereby providing a 32-processor system. The 32-processor system consists of four identical stand-alone 8-processor systems that are configured within the rack in such a manner as to minimize cross bar (processor/memory) bus lengths.

FIG. 1 is a front view of a single cellular computer module 100. Cellular computer module 100 includes chassis 110, processor board 114, and memory board 112. Processor board 114 and memory board 112 are connected to an interconnect board (interconnect assembly) 150. Interconnect assembly 150 provides for communication signals to be sent to and from processor board 114 and memory board 112.

Although illustrated in FIG. 1 as being connected to cellular computer module 100, interconnect assembly 150 is preferably a separate component that can be installed within or adjacent the chassis 110 prior to or after the insertion of module 100. Alternatively, interconnect assembly 150 may be mounted in a computer rack, and after cellular computer module 100 is inserted into the rack along an insertion axis, processor board 114 and memory board 112 can be connected to interconnect assembly 150.

As indicated above, FIG. 1 illustrates a front, schematic view of cellular computer module 100. As such, processor board 114 and memory board 112 are inserted into chassis 110 in a direction going into the page; that is, the portion of the block diagrams of processor board 114 and memory board 112 that is visible after processor board 114 and memory board 112 have been inserted into chassis 110 is shown in FIG. 1. Hereinafter, the axis along which processor board 114 and memory board 112 are inserted into chassis 110 will be referred to as an insertion axis. After processor board 114 and memory board 112 have been inserted into chassis 110 along the insertion axis, boards 114 and 112 are then moved toward interconnect assembly 150 until connectors on each of boards 114 and 112 have properly mated with respective connectors on interconnect assembly 150.

As such, processor board 114 and memory board 112 are moved toward interconnect assembly 150 in a direction that is substantially perpendicular to the direction of the insertion axis. Further details regarding a mechanism proposed to facilitate the installation of boards 112 and 114 are available in co-pending U.S. patent application Ser. No. 10/389,824, which is incorporated herein by reference.

Figure 2:
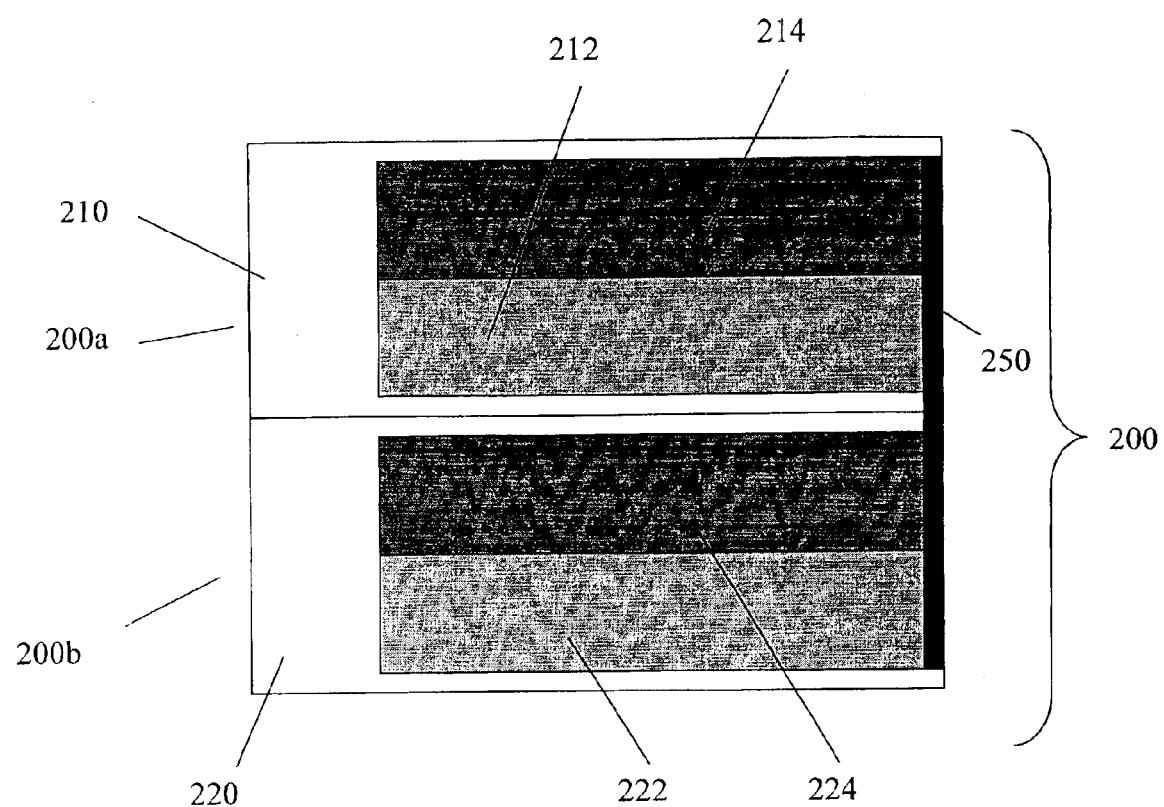
FIG. 2 is a front view of a block diagram of two cellular computer modules and an interconnect assembly in accordance with another exemplary embodiment of the present invention.

FIG. 2 illustrates a computer server system 200 including cellular computer module 200a and cellular computer module 200b. Cellular computer modules 200a and 200b are similar to cellular computer module 100 described by reference to FIG. 1. Computer server system 200 also includes interconnect assembly 250.

Cellular computer module 200a includes chassis 210, processor board 214, and memory board 212. Cellular computer module 200b includes chassis 220, processor board 224, and memory board 222. Processor board 214 and memory board 212 are inserted into chassis 210 along an insertion axis, as described above with respect to FIG. 1. Processor board 214 and memory board 212 may be inserted into chassis 210 as a single unit, or as separate boards.

After processor board 214 and memory board 212 have been inserted into chassis 210 along the insertion axis, boards 214 and 212 are moved in a direction that is substantially perpendicular to the insertion axis towards interconnect assembly 250. Processor board 214 and memory board 212 are moved in this direction until connectors on each of boards 214 and 212 mate with respective connectors included on interconnect assembly 250.

Similarly, processor board 224 and memory board 222 are inserted into chassis 220 along an insertion axis. They are then moved towards interconnect assembly 250 in a direction substantially perpendicular to the insertion axis until connectors on boards 224 and 222 mate with respective connectors on the interconnect assembly 250.

Interconnect assembly 250 may be installed into a rack of a computer system, for example, along a side thereof. In such an embodiment, cellular computer modules 200a and 200b could be inserted into receptacles in the computer rack that are adjacent interconnect assembly 250.

Figure 3:
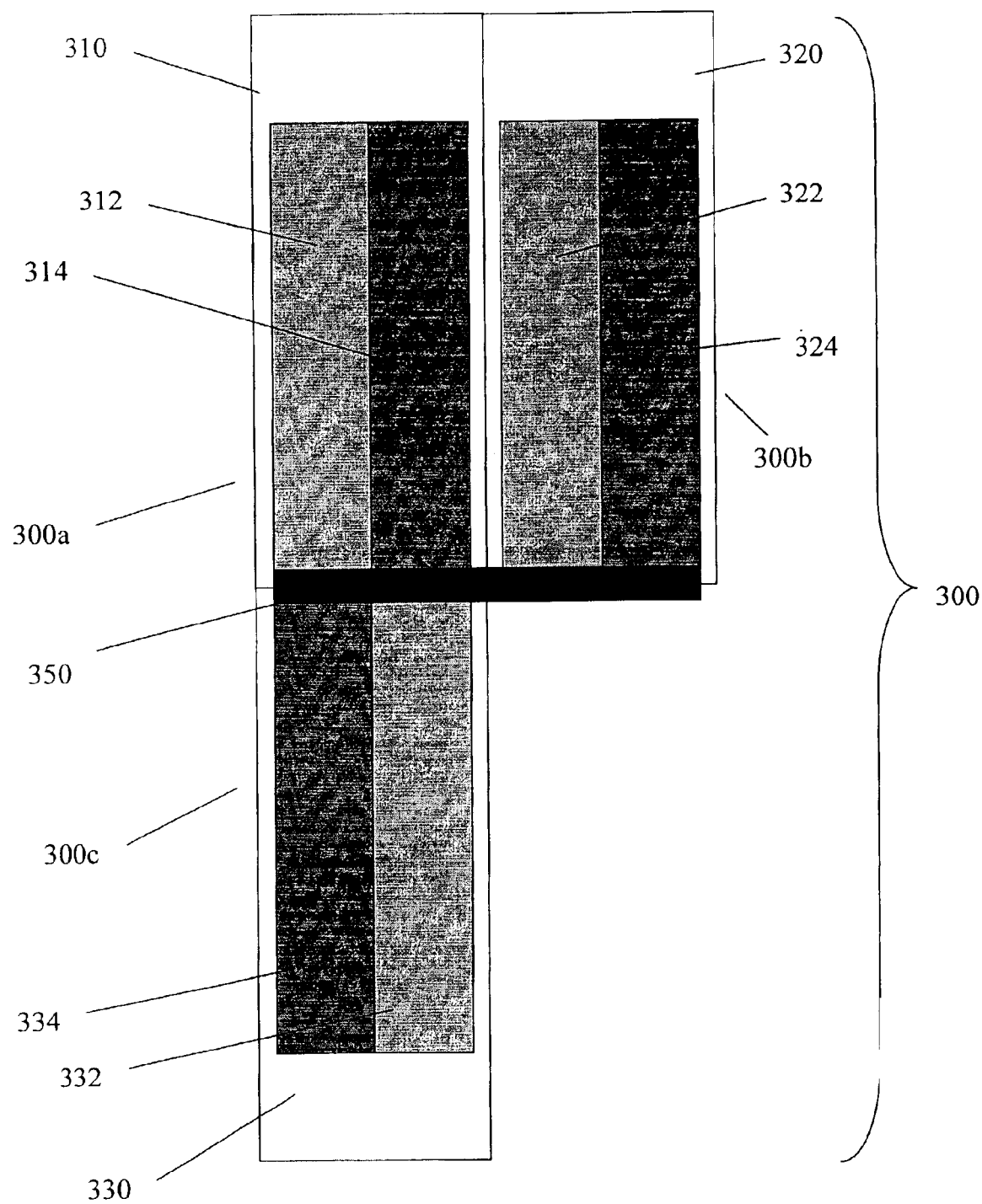
FIG. 3 is a front view of a block diagram illustrating three cellular computer modules and an interconnect assembly in accordance with yet another exemplary embodiment of the present invention.

FIG. 3 is a front view of a computer server system 300 including three cellular computer modules 300a, 300b, and 300c. Cellular computer module 300a includes chassis 310, processor board 314, and memory board 312. Cellular computer module 300b includes chassis 320, processor board 324, and memory board 322. Cellular computer module 300c includes chassis 330, processor board 334, and memory board 332.

Cellular computer modules 300a and 300b are oriented with respect to one another in a configuration similar to modules 200a and 200b described by reference to FIG. 2; that is, processor board 314 of cellular computer module 300a is positioned adjacent memory board 322 of cellular computer module 300b.

In contrast to the configuration illustrated in FIG. 2 and to the arrangement of modules 300a and 300b, cellular computer module 300c is "flipped" with respect to cellular computer module 300a. As such, processor board 334 in cellular computer module 300c is positioned opposite memory board 312 of cellular computer module 300a. Further, memory board 332 of cellular computer module 300c is positioned opposite processor board 314 of cellular computer module 300a.

By flipping the position of cellular computer module 300c with respect to cellular computer module 300a, reduced interconnect lengths between each of the cellular modules and interconnect assembly 350 is provided. More specifically, by flipping module 300c and by orienting modules 300a and 300b as shown, each processor board can be positioned adjacent to a memory board and each memory board can be positioned adjacent to a processor board.

As illustrated in the exemplary embodiment shown in FIG. 3, therefore, processor board 314 is adjacent memory board 312, processor board 332 (across the interconnect assembly 350), and memory board 322; processor board 324 is adjacent memory board 322; and processor board 334 is adjacent memory board 312 (across the interconnect assembly 350) and memory board 332. The lengths of the interconnects between the processors and memory can therefore be reduced, thereby increasing the speed and performance of the computer system, by (1) configuring the processor and memory boards within each module such that a processor board in a processor region is adjacent a memory board in a memory region, (2) orienting the modules that are on the same side of the interconnect assembly such that the processor board of one module is adjacent the memory board of the adjacent module, and (3) orienting the modules that are on the opposite sides of the interconnect assembly such that the processor board of one module is facing or at least partially aligned with the memory board of the corresponding module.

Although the schematic diagram provided in FIG. 3 shows the processor and memory regions of cells on opposite sides of the interconnect assembly to be completely aligned, it may be desirable to shift the processor and memory regions slightly with respect to one another. Such a configuration may be desirable to accommodate the connectors on the interconnect assembly. For example, if a processor board connector of one module were to be in complete alignment with a memory board connector of a module on an opposite side of the interconnect assembly, then the respective connectors on the interconnect assembly might interfere with one another.

Figure 4:
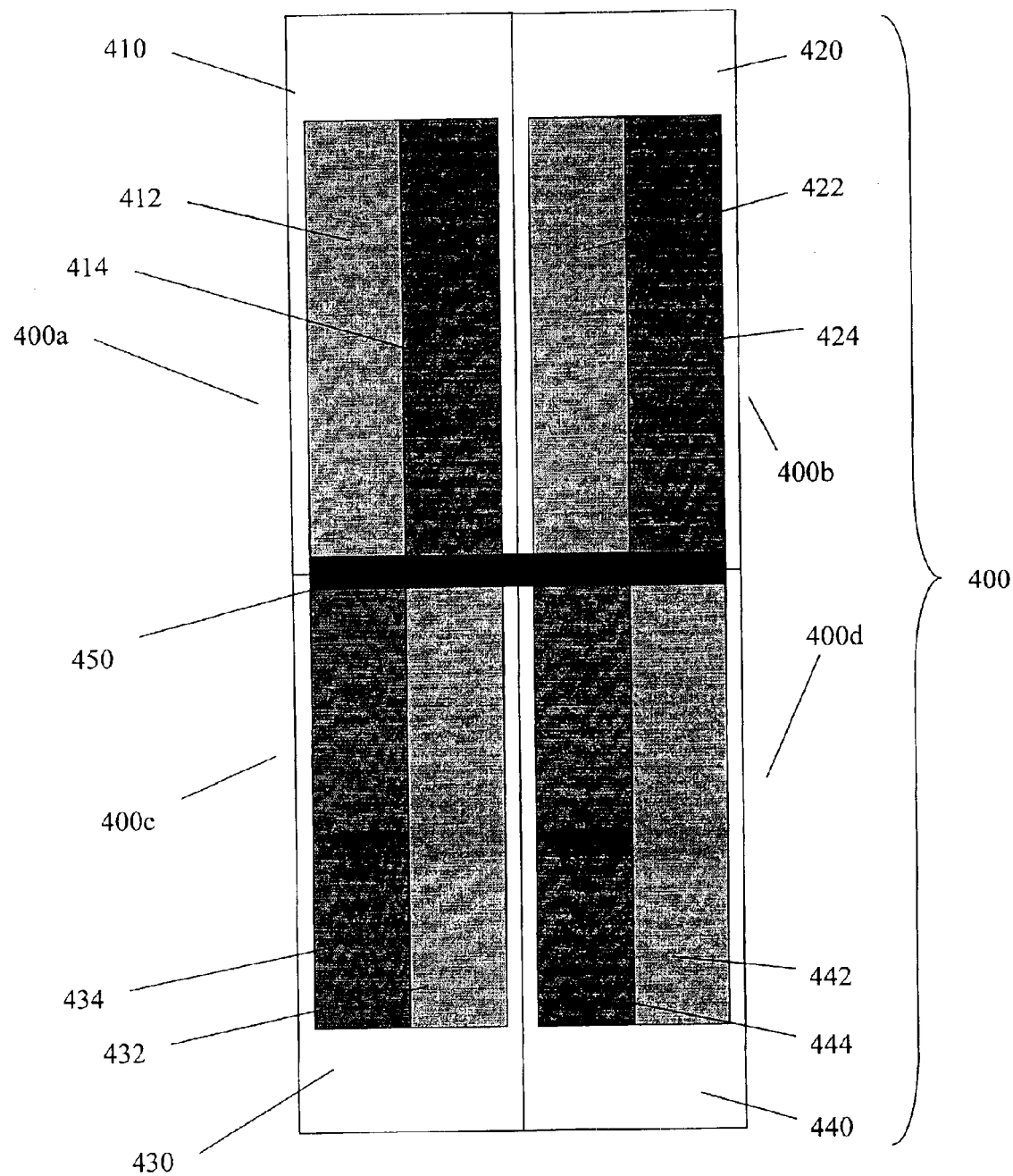
FIG. 4 is a front view of a block diagram illustrating four cellular computer modules and an interconnect assembly in accordance with still another exemplary embodiment of the present invention.

FIG. 4 illustrates a computer server system 400 including cellular computer modules 400a, 400b, 400c, and 400d. Each of cellular computer modules 400a, 400b, 400c, and 400d includes a respective: chassis 410, 420, 430, and 440; processor board 414, 424, 434, and 444; and memory board 412, 422, 432, and 442. Interconnect assembly 450 separates cellular computer module 400a from cellular computer module 400c. Further, interconnect assembly 450 separates cellular computer module 400b from cellular computer module 400d.

Cellular computer module 400c is flipped with respect to cellular computer module 400a such that processor board 434 is opposite memory board 412 and memory board 432 is opposite processor board 414. Further, cellular computer module 400d is flipped with respect to cellular computer module 400b such that processor board 444 is opposite memory board 422 and memory board 442 is positioned opposite processor board 424.

Also, processor board 414 of module 400a is adjacent the memory board 422 of module 400b on the same side of interconnect assembly 450. Likewise, processor board 444 of module 400d is adjacent the memory board 432 of module 400c on the same side of interconnect assembly 450. By configuring cellular computer modules 400a, 400b, 400c, and 400d in this manner, interconnect lengths between each of the modules and interconnect assembly 450 are reduced.

Although the cellular computer modules and computer server systems illustrated in FIGS. 1–4 are illustrated as stand alone units, each of these systems may be part of a larger computer system, such as a rack mounted computer server system.

Figure 5:
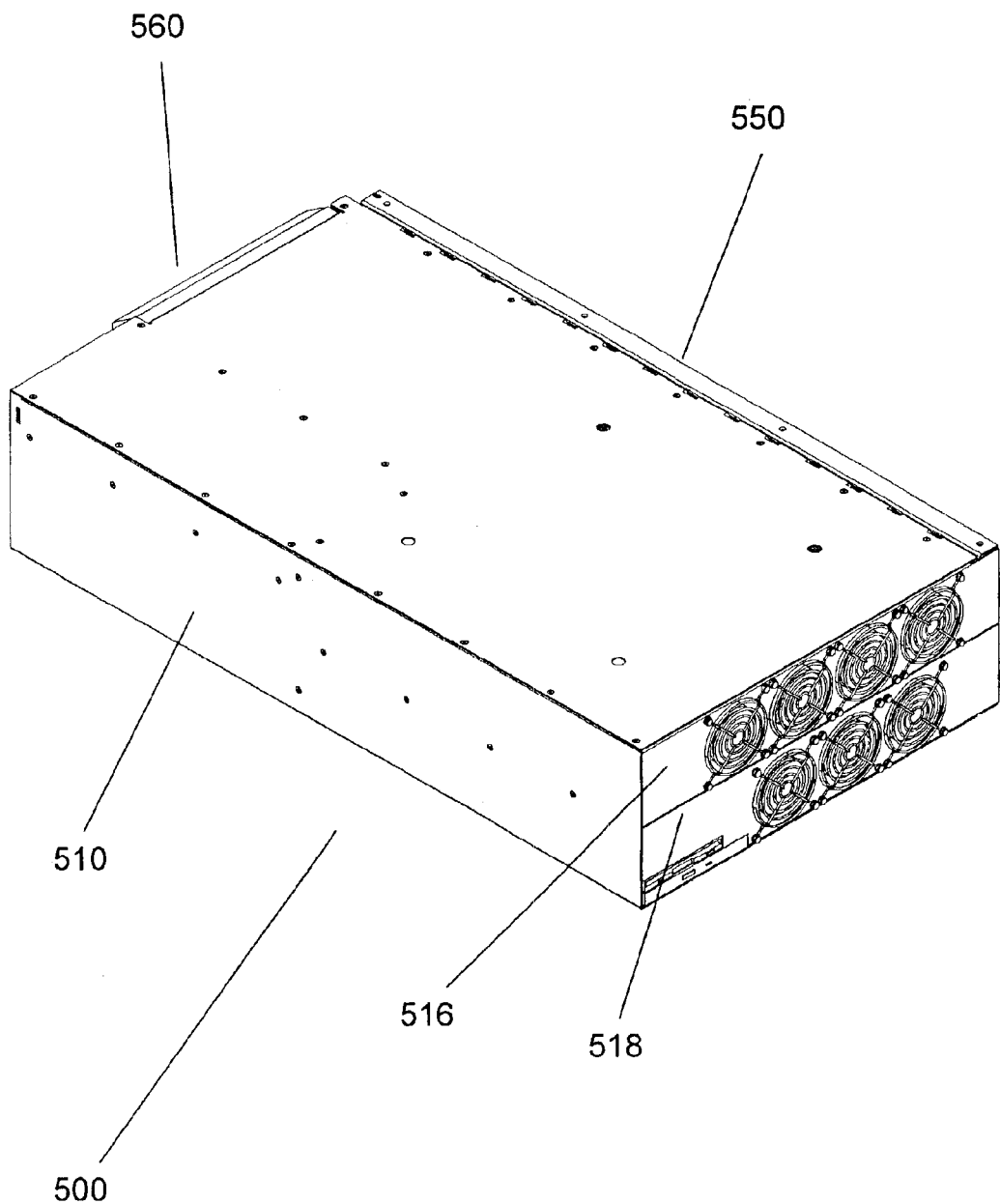
FIG. 5 is a perspective view of a computer module and an interconnect assembly in accordance with another exemplary embodiment of the present invention.

FIG. 5 illustrates a cellular computer module 500 coupled to an interconnect assembly 550. Cellular computer module 500 includes chassis 510 that houses a processor and memory board (not illustrated). The processor board is concealed by processor fan system 516, and the memory board is concealed by memory fan system 518. Processor fan system 516 includes four fan units while memory fan system 518 includes three fan units.

Processor fan system 516 is not referred to as such because it is intended to solely provide cooling air for the processor board. Rather, it is referred to as processor fan system 516 because it conceals the processor board that is housed within chassis 510. Similarly, memory fan system 518 is referred to as such because it conceals a memory board housed within chassis 510. A portion of an I/O module 560 is also illustrated in FIG. 5. Further details of the I/O module 560 are described in co-pending U.S. application Ser. No. 10/390,876, which is incorporated herein by reference. When cellular computer module 500 is installed into a computer rack, I/O module 560 may be accessed from an open rear portion of the rack, while processor fan system 516 and memory fan system 518 may be accessed from an open front portion of the rack.

Figure 6:
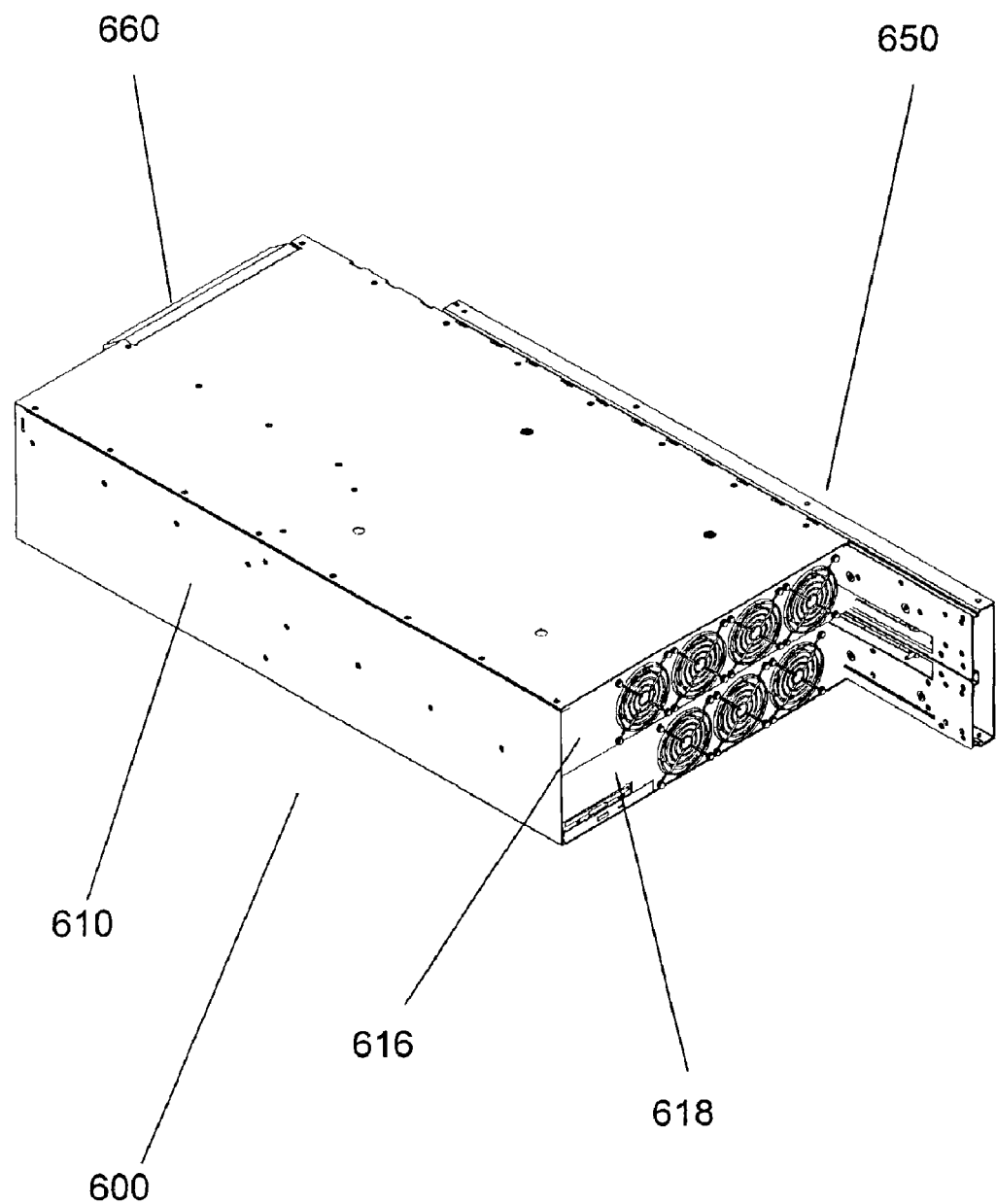
FIG. 6 is another perspective view of the computer module and interconnect assembly shown in FIG. 5.

FIG. 6 illustrates a cellular computer module 600 that is similar to cellular computer module 500 described by reference to FIG. 5. Cellular computer module 600 includes chassis 610, I/O module 660, processor fan system 616, and memory fan system 618. In an exemplary embodiment of the present invention, interconnect assembly 650 may be slid with respect to chassis 610, as shown in FIG. 6. More specifically, the interconnect assembly 650 is optionally a modular assembly that can be removed from the rack for upgrade, repair, or maintenance, as needed. Further details of the interconnect assembly 650 are described in co-pending U.S. application Ser. No. 10/390,370, which is incorporated herein by reference.

Figure 7:
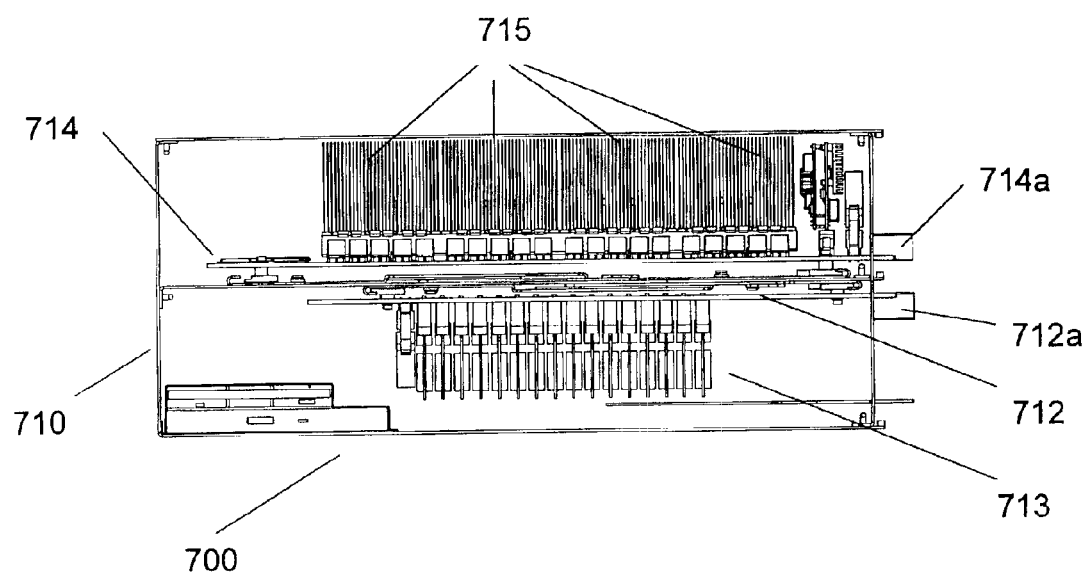
FIG. 7 is an internal front view of a computer module in accordance with an exemplary embodiment of the present invention.

FIG. 7 illustrates a cellular computer module 700 that is similar to the cellular computer modules 500 and 600 illustrated in FIGS. 5 and 6; however, in FIG. 7 the processor fan system and memory fan system have been removed to reveal the internal components of the system. Cellular computer module 700 includes chassis 710, processor board 714, and memory board 712. Processors 715 (and accompanying heat sinks and related components) are installed on processor board 714.

Although four processors are shown in FIG. 7, any number of processors may be included on processor board 714. In an exemplary embodiment of the present invention, eight processors 715 are included on processor board 714, arranged in two rows of four processors. Memory unit 713 is installed on memory board 712.

Processor connector 714a extends from processor board 714. Similarly, memory connector 712a extends from memory board 712. Processor connector 714a and memory connector 712a are used to connect the boards in cellular computer modules 700 to an interconnect assembly (not shown in FIG. 7).

As shown in FIG. 7, processor connector 714a and memory connector 712a are positioned at substantially equidistant positions with respect to a divider or dividing line that separates chassis 710 into the processor region of chassis 710 (that houses processor board 714) and the memory region of chassis 710 (that houses memory board 712). As is illustrated in the embodiment shown in FIG. 8, the processor region is the portion of the interior of the chassis 710 that is above the divider that extends completely across the chassis 710. Similarly, the memory region is the portion of the interior of the chassis 710 that is below the divider that extends completely across the chassis 710.

The divider between the processor and memory regions of the chassis interior may take the form of a shelf of chassis material that bisects the chassis interior into two substantially equal parts. Additional details of the shelf, and the mechanism by which the processor and memory boards are mounted to the shelf, are described in co-pending U.S. application Ser. No. 10/390,370, which is incorporated herein by reference.

The equidistant positioning of connectors 714a and 712a allows for the cellular computer module 700 to be flipped in its orientation, while the connectors continue to have the same orientation with respect to one another.

Figure 8:
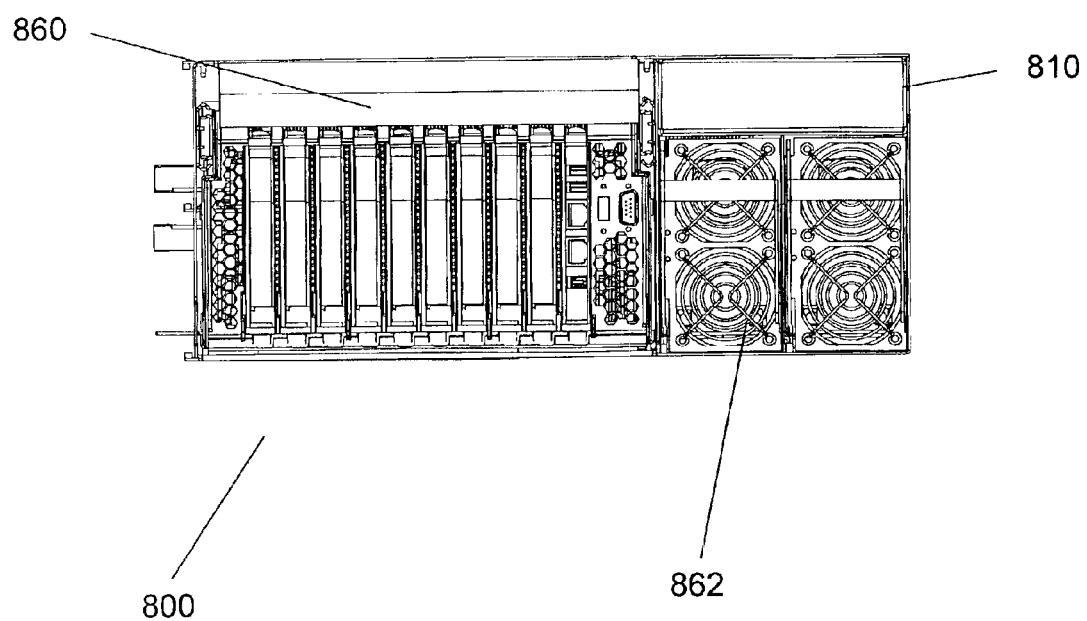
FIG. 8 is a rear view of the computer module shown in FIG. 7.

FIG. 8 is a rear view of a cellular computer module 800. Cellular computer module 800 includes chassis 810, I/O module 860, and fan system 862. I/O module 860 may be used to house a number of I/O components such as PCI cards.

Figure 9:
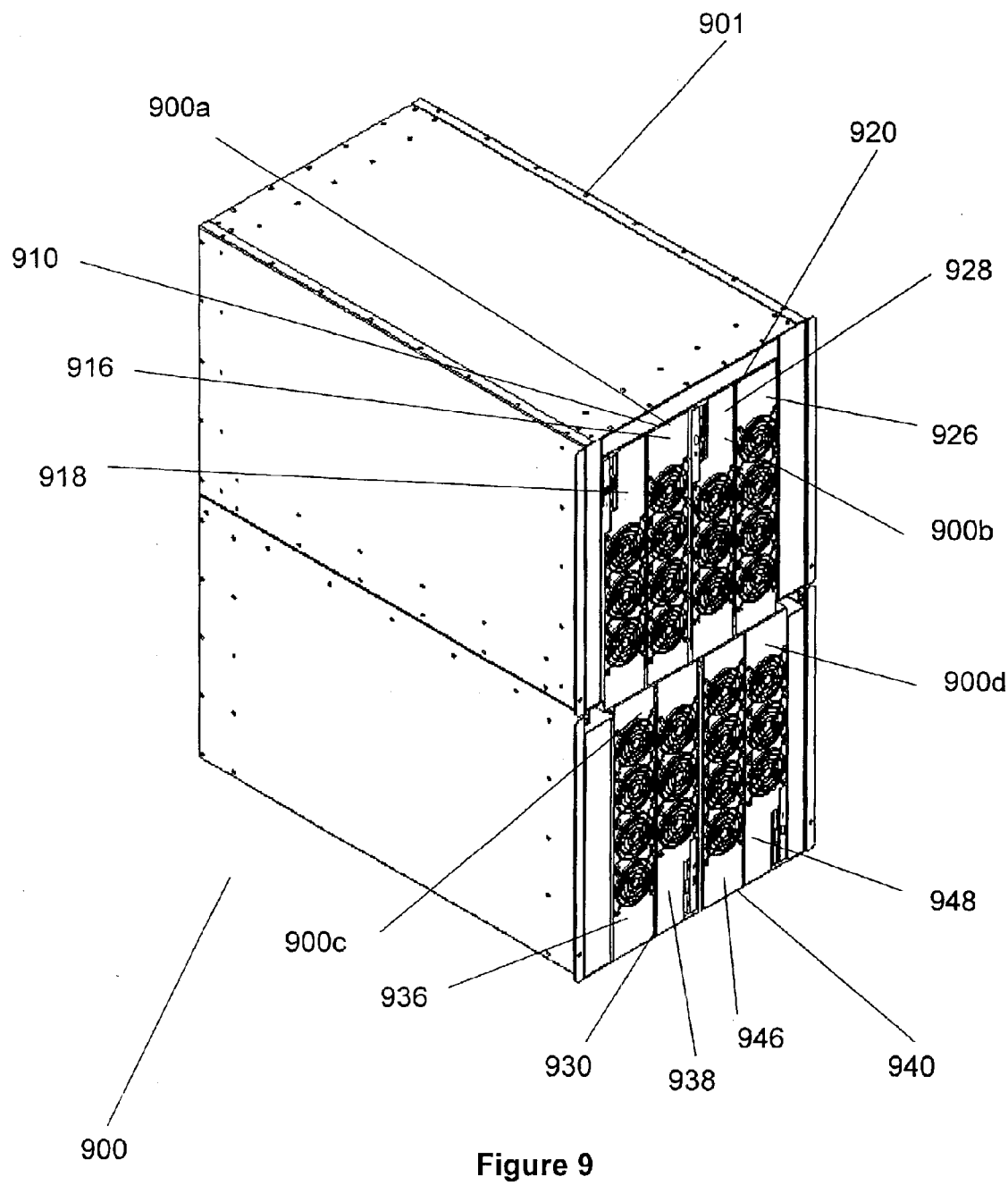
FIG. 9 is a perspective view of a computer server system in accordance with an exemplary embodiment of the present invention.

FIG. 9 illustrates a computer server system 900 including a rack (not shown) configured to receive frame 901 that holds four modules. More specifically, computer server system 900 includes cellular computer modules 900a, 900b, 900c, and 900d. Each of cellular computer modules 900a, 900b, 900c, and 900d includes a respective: chassis 910, 920, 930, 940; processor fan system 916, 926, 936, and 946; and memory fan system 918, 928, 938, and 948.

As with the previously described embodiments, each of the fan systems (e.g., 916 and 918) conceals a respective processor or memory board. Additional details of the fan systems are described in co-pending U.S. application Ser. No. 10/390,369, which is incorporated herein by reference. Although not visible in FIG. 9, an interconnect board separates cellular computer module 900a from cellular computer module 900c, and also separates cellular computer module 900b from cellular computer module 900d.

Figure 10:
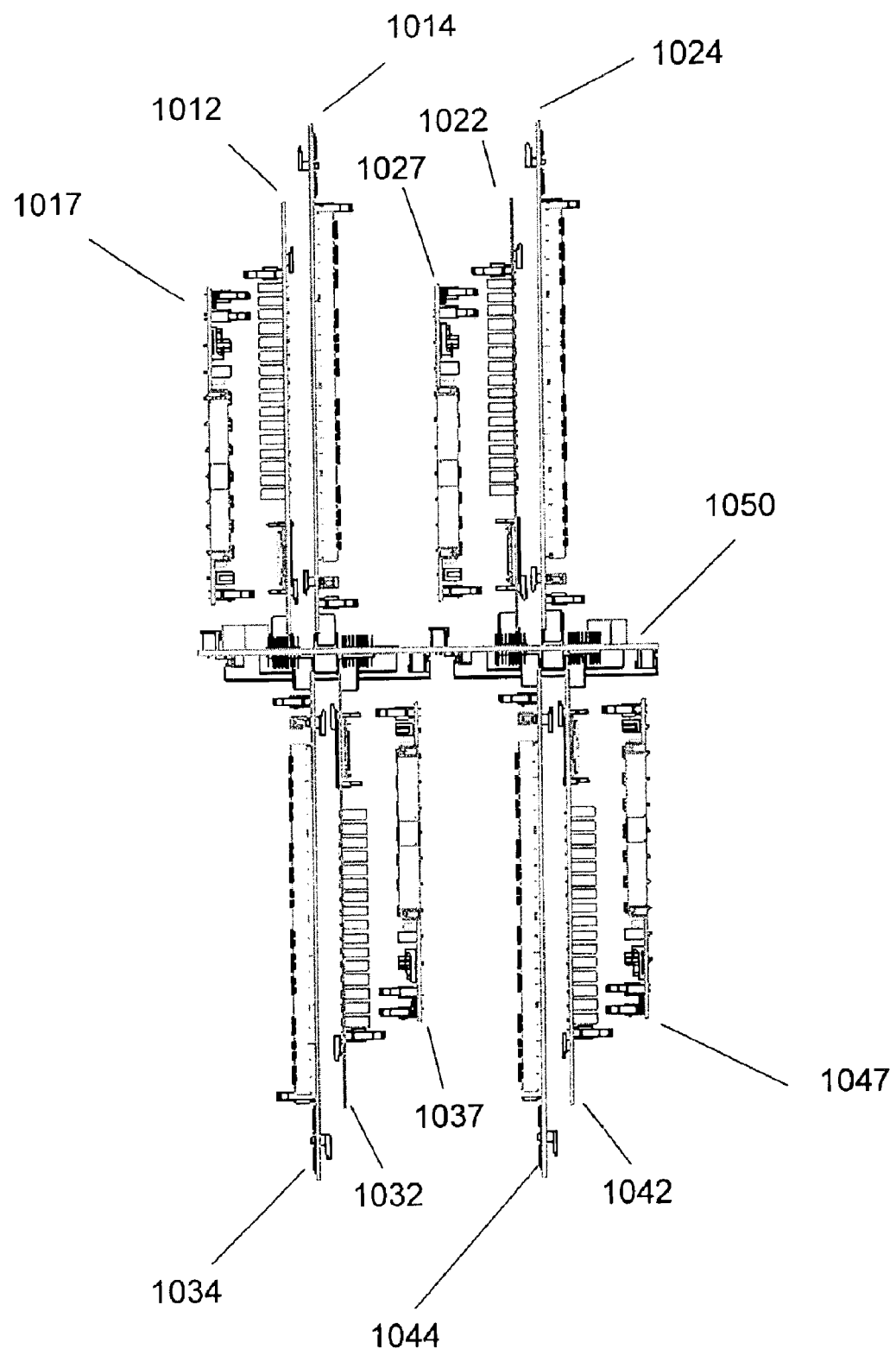
FIG. 10 is a front view of internal components of a computer server system in accordance with an exemplary embodiment of the present invention.

FIG. 10 illustrates an internal portion of a computer server system, such as computer server system 900 illustrated in FIG. 9, with the chassis components removed to reveal the configuration of the processor and memory boards of a 32 processor system as they are connected to an interconnect board. Specifically, FIG. 10 illustrates a portion of the internal components of four cellular computer modules such as cellular computer modules 900a, 900b, 900c, and 900d (illustrated in FIG. 9). For example, processor board 1014, memory board 1012, and memory module 1017 would be included in one cellular computer module such as cellular computer module 900a. Similarly, processor board 1024, memory board 1022, and memory module 1027 would be included in another cellular computer module (e.g., 900b). Further, processor board 1034, memory board 1032, and memory module 1037 would be included in another cellular computer module (e.g., 900c). Further still, processor board 1044, memory board 1042, and memory module 1047 would also be included in yet another cellular computer module (e.g., 900d). Each processor board (1014, 1024, 1034, and 1044) and memory board (1012, 1022, 1032, and 1042) are connected to interconnect assembly 1050.

Similar to the embodiment illustrated in FIG. 4, the processor boards and memory boards positioned below interconnect assembly 1050 in FIG. 10 are flipped with respect to the processor and memory boards positioned above interconnect assembly 1050. More specifically, memory board 1032 is positioned opposite processor board 1014. Further, processor board 1034 is positioned opposite memory board 1012. Further still, memory board 1042 is positioned opposite processor board 1024, and processor board 1044 is positioned opposite memory board 1022.

As described earlier, this configuration provides for shorter interconnect lengths between each of the processor and memory boards and the interconnect assembly 1050. Thus the speed and performance of the system is improved. While processor and memory boards are described as being "opposite" on another, the connectors for each of the boards are skewed. For example, from left to right, the connectors on interconnect assembly 1050 include connectors for mating to the memory board 1012, processor board 1034, processor board 1014, memory board 1032, memory board 1022, processor board 1044, processor board 1024, memory board 1042. Accordingly, while processor and memory boards are "opposite" one another by virtue of the positioning of processor and memory boards within each module and the orientation of the modules with respect to one another, the boards are actually connected to the interconnect assembly in a staggered configuration.

In the exemplary embodiment illustrated in FIG. 10, memory board 1032 is positioned opposite, and slightly staggered from, processor board 1014. Memory board 1032 is staggered with respect to processor board 1014 such that their respective connectors that connect to interconnect assembly 1050 do not interfere with one another, as mentioned previously. Similarly, processor board 1034 is positioned opposite from and staggered with respect to memory board 1012, processor board 1044 is positioned opposite from and staggered with respect to memory board 1022, and memory board 1042 is positioned opposite from and staggered with respect to processor board 1024.

Figure 11:
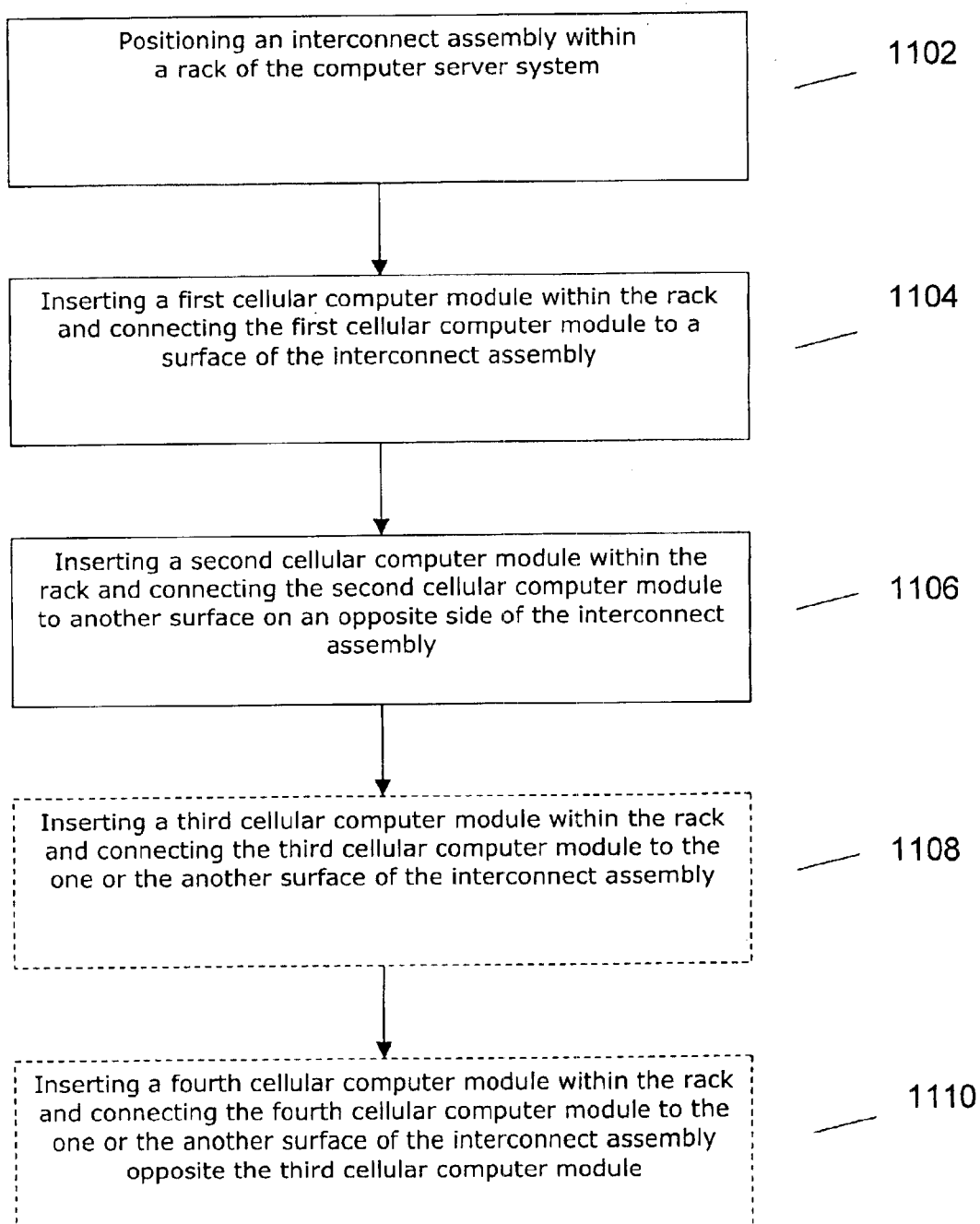
FIG. 11 is a flow diagram illustrating a method of configuring a computer server system in accordance with an exemplary embodiment of the present invention.

FIG. 11 illustrates a method of configuring a computer server system. At step 1102, an interconnect assembly is positioned within a rack of the computer server system. At step 1104, a first cellular computer module is inserted into the rack and connected to a surface of the interconnect assembly. For example, the first cellular computer module is inserted along an insertion axis into the rack and the boards of that module are then moved in a direction perpendicular to the insertion axis in order to connect connectors of the first cellular computer module to connectors on a surface of the interconnect assembly.

At step 1106, a second cellular computer module is inserted into the rack and connected to another surface of the interconnect assembly. This surface of the interconnect assembly is opposite the surface to which the first cellular computer module is connected. Therefore, the first cellular computer module is separated from the second cellular computer module by the interconnect assembly. The first cellular computer module includes a respective processor board and memory board. The second cellular computer module also includes a respective processor board and memory board. Through the steps of inserting the first and second cellular computer modules, the processor board of the first cellular computer module is positioned opposite the memory board of the second cellular computer module. In another embodiment of the present invention, the memory board of the first cellular computer module is positioned opposite the processor board of the second cellular computer module.

Further, in yet another exemplary embodiment of the present invention, the processor board of the first cellular computer module is positioned opposite from and staggered with respect to the memory board of the second cellular computer module. In yet another exemplary embodiment, the memory board of the first cellular computer module may be positioned opposite from and staggered with respect to the processor board of the second cellular computer module.

FIG. 11 also includes additional optional steps 1108 and 1110. At step 1108, a third cellular computer module is installed within the rack and connected to one of the surfaces of the interconnect assembly. As such, the third cellular computer module will be positioned adjacent either the first or the second cellular computer module when connected to the interconnect assembly. At step 1110, a fourth cellular computer module is installed in the rack and connected to the interconnect assembly. The fourth cellular computer module is connected to a surface on a side of the interconnect assembly that is opposite to the side to which the third cellular computer module is connected. As such, the third and fourth cellular computer modules are separated by the interconnect assembly.

After steps 1108 and 1110, the processor board of the third cellular board module is positioned opposite from (and may be staggered with respect to) the memory board of the fourth cellular computer module. Further, the memory board of the third cellular computer module is positioned opposite from (and may be staggered with respect to) the processor board of the fourth cellular computer module.

By configuring the cellular computer modules in a computer server system as disclosed in the various embodiments of the present invention, the interconnect and bus lengths between each of the cellular computer modules and the interconnect assembly may be substantially reduced, thereby providing for a decrease in the signal transmission time between each of the cellular computer modules.

Although this invention has been described with reference to computer servers, it is recognized that this invention can also be utilized in other modular or scalable computer systems. Also, although this invention has been described with reference to embodiments having from one to four modules, any number of modules or cells can be used.

It will be appreciated that other modifications can be made to the illustrated embodiments without departing from the scope of this invention, which is separately defined in the appended claims.

What is claimed:

1. A computer module for use in a scalable computer system, said computer module comprising:
    a chassis at least partially defining an interior;
    a processor board configured for insertion into a processor region of said interior of said chassis along an insertion axis, said processor board including at least one connector for communicating signals to and from said processor board, said connector of said processor board being oriented along a connection axis that is substantially perpendicular to said insertion axis; and
    a memory board configured for insertion into a memory region of said interior of said chassis along said insertion axis, said memory board including at least one connector for communicating signals to and from said memory board, said connector of said memory board being oriented along said connection axis.

2. The computer module of claim 1 wherein said at least one connector of said processor board and said at least one connector of said memory board are arranged along a side wall of said chassis and are oriented in a substantially parallel direction with respect to one another.

3. The computer module of claim 1 wherein said processor region and said memory region of said interior of said chassis are positioned adjacent one another and extend in a substantially parallel direction with respect to one another.

4. The computer module of claim 1 wherein said chassis defines said interior such that said processor region and said memory region are substantially equal in volume.

5. The computer module of claim 1 wherein said at least one processor connector and said at least one memory connector are provided at substantially equidistant positions with respect to the border between said processor region and said memory region.

6. A computer system comprising:
 a rack configured to accommodate components of said computer system;
 an interconnect assembly mounted in said rack; and
 at least two cellular computer modules, each of said cellular computer modules including a processor board and a memory board, said cellular computer modules being connected to opposite surfaces of said interconnect assembly such that said processor board of one of said cellular computer modules is substantially opposite said memory board of another of said cellular computer modules.

7. The computer system of claim 6 wherein each of said at least two cellular computer modules is interchangeable with one another within said computer system.

8. The computer system of claim 6 wherein said memory board of said one cellular computer module is oriented to be substantially opposite said processor board of said another cellular computer module.

9. The computer system of claim 6 additionally comprising a third cellular computer module positioned adjacent either of said one or said another of said cellular computer modules, said third cellular computer module including a processor board and a memory board, said memory board of said third cellular computer module being positioned adjacent said processor board of said one or said another of said cellular computer modules.

10. The computer system of claim 9 additionally comprising a fourth cellular computer module including a processor board and a memory board, said third and said fourth cellular computer modules being connected to opposite surfaces of said interconnect assembly such that said processor board of one of said third and fourth cellular computer modules is substantially opposite said memory board of said other of said third and fourth cellular computer modules.

11. The computer system of claim 10 wherein said memory board of said one of said third and fourth cellular computer modules is positioned opposite said processor board of said other of said third and fourth cellular computer modules and is separated from said processor board of said other of said third and fourth cellular computer modules by said interconnect assembly.

12. The computer system of claim 11 wherein said processor board of each of said one cellular computer module, said another cellular computer module, said third cellular computer module, and said fourth cellular computer module each include a plurality of processors.

13. The computer system of claim 6 wherein said processor board of said one cellular computer module is substantially opposite from and staggered with respect to said memory board of said another cellular computer module.

14. The computer system of claim 8 wherein said memory board of said one cellular computer module is substantially opposite from and staggered with respect to said processor board of said another cellular computer module.

15. The computer system of claim 11 wherein said processor board of said one cellular computer module is substantially opposite from and staggered with respect to said memory board of said another cellular computer module, and said processor board of said one of said third and fourth cellular computer modules is substantially opposite from and staggered with respect to said memory board of said other of said third and fourth cellular computer modules.

16. A method of configuring a computer system comprising the steps of:
 positioning an interconnect assembly within a rack of the computer system;
 inserting a first cellular computer module having a processor board and a memory board within the rack and connecting the processor and memory boards of the first cellular computer module to a surface of the interconnect assembly;
 inserting a second cellular computer module having a processor board and a memory board within the rack and connecting the processor and memory boards of the second cellular computer module to an opposite surface of the interconnect assembly such that the positions of the cellular computer modules correspond to one another with respect to the interconnect assembly, and such that the processor board of the first cellular computer module is substantially opposite the memory board of the second cellular computer module and the memory board of the first cellular computer module is substantially opposite the processor board of the second cellular computer module.

17. The method of claim 16 wherein said step of inserting the first cellular computer module includes inserting the first cellular computer module into the rack along an insertion axis and moving the processor and memory boards of the first cellular computer module towards the interconnect assembly in a direction substantially perpendicular to the insertion axis such that the processor and memory boards of the first cellular computer module are connected to the surface of the interconnect assembly.

18. The method of claim 16 further comprising the step of:
 inserting a third cellular computer module having a processor and memory board within the rack and connecting the processor and memory boards of the third cellular computer module to the one or the another surface of the interconnect assembly such that the third cellular computer module is positioned adjacent one of the first and the second cellular computer modules.

19. The method of claim 18 further comprising the step of:
 inserting a fourth cellular computer module having a processor and memory board within the rack and connecting the processor and memory boards of the fourth cellular computer module to the one or the another surface of the interconnect assembly that the third cellular computer module is not connected to, such that the processor board of the third cellular computer module is substantially opposite the memory board of the fourth cellular computer module and the memory board of the third cellular computer module is substantially opposite the processor board of the fourth cellular computer module.

20. The method of claim 19 wherein said step of inserting the first cellular computer module includes inserting the first cellular computer module into the rack along an insertion axis and moving the processor and memory boards of the first cellular computer module towards the interconnect assembly in a direction substantially perpendicular to the insertion axis such that the processor and memory boards of the first cellular computer module are connected to the surface of the interconnect assembly,
 said step of inserting the second cellular computer module includes inserting the second cellular computer module into the rack along the insertion axis and moving the processor and memory boards of the second cellular computer module towards the interconnect assembly in another direction substantially perpendicular to the insertion axis such that the processor and memory boards of the second cellular computer module are connected to the another surface of the interconnect assembly,
 said step of inserting the third cellular computer module includes inserting the third cellular computer module into the rack along the insertion axis and moving the processor and memory boards of the third cellular computer module towards the interconnect assembly in the direction substantially perpendicular to the insertion axis such that the processor and memory boards of the third cellular computer module are connected to the surface of the interconnect assembly, and said step of inserting the fourth cellular computer module includes inserting the fourth cellular computer module into the rack along the insertion axis and moving the processor and memory boards of the fourth cellular computer module towards the interconnect assembly in the another direction substantially perpendicular to the insertion axis such that the processor and memory boards of the fourth cellular computer module are connected to the another surface of the interconnect assembly.

* * * * *